(12) United States Patent
Frank et al.

(10) Patent No.: US 9,212,417 B2
(45) Date of Patent: *Dec. 15, 2015

(54) COATED ARTICLE WITH LOW-E COATING HAVING TITANIUM OXIDE LAYER AND/OR NICR BASED LAYER(S) TO IMPROVE COLOR VALUES AND/OR TRANSMISSION, AND METHOD OF MAKING SAME

(71) Applicant: Guardian Industries Corp., Auburn Hills, MI (US)

(72) Inventors: Marcus Frank, Gelnhausen (DE); Nancy Bassett, Macedon, NY (US); Bryce Corsner, Seneca Falls, NY (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/267,029

(22) Filed: May 1, 2014

(65) Prior Publication Data
US 2014/0242382 A1 Aug. 28, 2014

Related U.S. Application Data

(63) Continuation of application No. 12/453,125, filed on Apr. 29, 2009, now Pat. No. 8,734,920.

(51) Int. Cl.
*C23C 14/18* (2006.01)
*C03C 17/36* (2006.01)

(52) U.S. Cl.
CPC .............. *C23C 14/18* (2013.01); *C03C 17/36* (2013.01); *C03C 17/361* (2013.01); *C03C 17/366* (2013.01); *C03C 17/3613* (2013.01); *C03C 17/3626* (2013.01); *C03C 17/3639* (2013.01); *C03C 17/3644* (2013.01); *C03C 17/3649* (2013.01); *C03C 17/3652* (2013.01); *C03C 17/3655* (2013.01); *C03C 17/3681* (2013.01); *C03C 17/3689* (2013.01);
(Continued)

(58) Field of Classification Search
None
See application file for complete search history.

(56) References Cited

U.S. PATENT DOCUMENTS 6,576,349 B2   6/2003   Lingle et al.
6,916,408 B2   7/2005   Laird et al.
(Continued)

OTHER PUBLICATIONS

U.S. Appl. No. 12/453,125, filed Apr. 29, 2009; Frank et al.

*Primary Examiner* — David Sample
(74) *Attorney, Agent, or Firm* — Nixon & Vanderhye P.C.

(57) ABSTRACT

Certain example embodiments of this invention relate to a coated article including a low-E coating. In certain example embodiments, a titanium oxide inclusive bottom layer stack and/or a NiCr-based layer(s) are designed to improve b* coloration values and/or transmission of the coated article. These layer stack portions also are advantageous in that they permit a double-silver coated article to achieve (i) an LSG value ($T_{vis}$/SHGC) of at least 2.0, (ii) an SHGC value of no greater than 35%, more preferably no greater than 33, 32 or 30%, and (iii) a U-value (BTU $h^{-1}$ $ft^{-2}$ $°F.^{-1}$) (e.g., x=12 mm) of no greater than 0.30, more preferably no greater than 0.28 or 0.25. In certain example embodiments, the titanium oxide based layer may be an interlayer provided in a bottom portion of the layer stack between first and second layers comprising silicon nitride. Coated articles according to certain example embodiments of this invention may be used in the context of insulating glass (IG) window units, other types of windows, or in any other suitable application.

3 Claims, 1 Drawing Sheet

US 9,212,417 B2
Page 2

(52) U.S. Cl.
CPC .... *C03C 2217/211* (2013.01); *C03C 2217/212* (2013.01); *C03C 2217/216* (2013.01); *C03C 2217/218* (2013.01); *C03C 2217/219* (2013.01); *C03C 2217/228* (2013.01); *C03C 2217/256* (2013.01); *C03C 2217/26* (2013.01); *C03C 2217/261* (2013.01); *C03C 2217/27* (2013.01); *C03C 2217/281* (2013.01); *Y02B 80/24* (2013.01); *Y10T 428/12549* (2015.01); *Y10T 428/265* (2015.01)

(56) References Cited

U.S. PATENT DOCUMENTS

| | | |
|---|---|---|
| 6,936,347 B2 | 8/2005 | Laird et al. |
| 6,942,923 B2 * | 9/2005 | Stachowiak .................. 428/428 |
| 7,081,302 B2 | 7/2006 | Lemmer et al. |
| 7,294,402 B2 | 11/2007 | Laird |
| 8,734,920 B2 | 5/2014 | Frank et al. |
| 2003/0049464 A1 | 3/2003 | Glenn et al. |
| 2003/0150711 A1 | 8/2003 | Laird |
| 2003/0175529 A1 * | 9/2003 | Stachowiak .................. 428/432 |
| 2004/0005467 A1 | 1/2004 | Neuman et al. |
| 2004/0086723 A1 | 5/2004 | Thomsen et al. |
| 2004/0101694 A1 | 5/2004 | Lingle et al. |
| 2005/0196622 A1 | 9/2005 | Laird et al. |
| 2005/0202254 A1 | 9/2005 | Nunez-Regueiro et al. |
| 2005/0202255 A1 | 9/2005 | Lemmer et al. |
| 2006/0046074 A1 | 3/2006 | Ferreira et al. |
| 2007/0166553 A1 * | 7/2007 | Nunez-Regueiro et al. .. 428/426 |
| 2008/0008876 A1 | 1/2008 | Laird et al. |
| 2008/0070044 A1 | 3/2008 | Blacker et al. |

* cited by examiner

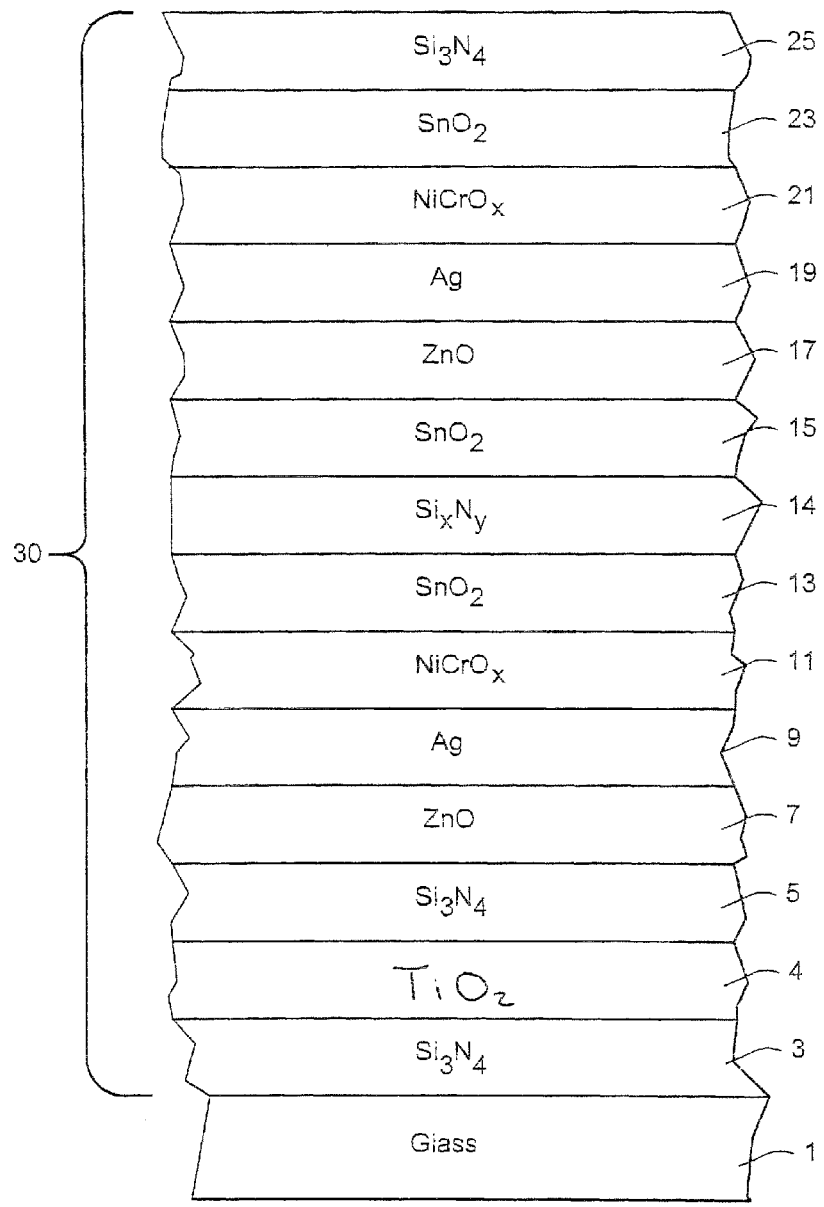

COATED ARTICLE WITH LOW-E COATING HAVING TITANIUM OXIDE LAYER AND/OR NICR BASED LAYER(S) TO IMPROVE COLOR VALUES AND/OR TRANSMISSION, AND METHOD OF MAKING SAME

This application is a continuation of application Ser. No. 12/453,125 filed Apr. 29, 2009, the entire disclosure of which is hereby incorporated herein by reference in this application.

Certain example embodiments of this invention relate to a coated article including a low-E coating. In certain example embodiments, a titanium oxide inclusive bottom layer stack and a NiCr-based layer(s) are designed to improve b* coloration values and/or transmission of the coated article. These layer stack portions also are advantageous in that they permit a double-silver coated article to achieve (i) an LSG value ($T_{vis}$/SHGC) of at least 2.0, (ii) an SHGC value of no greater than 35%, more preferably no greater than 33, 32 or 30%, and (iii) a U-value (BTU $h^{-1}$ $ft^{-2}$ ° $F.^{-1}$) (e.g., x=12 mm) of no greater than 0.30, more preferably no greater than 0.28 or 0.25. In certain example embodiments, the titanium oxide based layer may be an interlayer comprising titanium oxide provided in a bottom portion of the layer stack, between first and second layers comprising silicon nitride, and located between the glass substrate and the bottom infrared (IR) reflecting layer comprising silver. Coated articles according to certain example embodiments of this invention may be used in the context of insulating glass (IG) window units, monolithic applications, laminated windows, other types of windows, or in any other suitable application such as in electronic devices.

BACKGROUND OF THE INVENTION

Coated articles are known in the art for use in window applications such as insulating glass (IG) window units, vehicle windows, and/or the like.

In certain situations, designers of coated articles often strive for a combination of desirable visible transmission, desirable color values, high LSG ($T_{vis}$/SHGC) values, low emissivity (or emittance), low SHGC values, and low sheet resistance ($R_s$). High visible transmission for example may permit coated articles to be more desirable in certain window applications, whereas low-emissivity (low-E), low SHGC, high LSG, and low sheet resistance characteristics permit such coated articles to block significant amounts of IR radiation so as to reduce for example undesirable heating of vehicle or building interiors.

U.S. Patent Document 2005/0202254, commonly owned and hereby incorporated herein by reference, discloses a coated article having the following layers on a glass substrate, from the glass substrate outwardly.

Layer
Glass Substrate
$TiO_2$
$Si_3N_4$
ZnO
Ag
$NiCrO_x$
$SnO_2$
$Si_3N_4$
$SnO_2$
ZnO
Ag
$NiCrO_x$
$SnO_2$
$Si_3N_4$ While the aforesaid coated article is heat treatable, and has many desirable and good characteristics, it does have one or more of the following problems: (a) its LSG values ($T_{vis}$/SHGC) being too low, and (b) its SHGC values being too high.

U.S. Patent Document 2008/0070044, commonly owned herewith, discloses another coated article. While the aforesaid coated article is heat treatable, and has many desirable and good characteristics, it does have one or more of the following problems: (a) its LSG values ($T_{vis}$/SHGC) being too low, (b) its SHGC values being too high, and (c) undesirable b* value.

In certain example embodiments of this invention, one or more of the above-identified problems can be solved. While certain preferred embodiments solve all of the above problems, other embodiments of this invention may only solve one or two of the above-identified problems.

BRIEF SUMMARY OF EXAMPLE EMBODIMENTS OF THE INVENTION

In certain example embodiments of this invention, a coated article including a low-E coating is provided, and/or a method of making the same. In certain example embodiments, a color tuning titanium oxide inclusive bottom layer stack and a NiCr-based layer(s) is/are designed to improve b* coloration values and/or transmission of the coated article. These layer stack portions also are advantageous in that they permit a double-silver coated article to achieve one or more of: (i) an LSG value ($T_{vis}$/SHGC) of at least 2.0, (ii) an SHGC value of no greater than 35%, more preferably no greater than 33, 32 or 30%, and (iii) a U-value (BTU $h^{-1}$ $ft^{-2}$ ° $F.^{-1}$) (e.g., x=12 mm) of no greater than 0.30, more preferably no greater than 0.28 or 0.25. Thus, the use of this layer(s) provides for color tuning advantages as well as improved optical and SHGC advantages in the coated article. In certain example embodiments, the titanium oxide based layer may be an interlayer comprising titanium oxide provided in a bottom portion of the layer stack, between first and optionally second layers comprising silicon nitride or the like, and located between the glass substrate and the bottom infrared (IR) reflecting layer comprising silver. Coated articles according to certain example embodiments of this invention may be used in the context of insulating glass (IG) window units, other types of windows, or in any other suitable application. In certain example embodiments, the titanium oxide based color tuning layer is from about 40-400 Å thick, more preferably from about 50-200 Å thick, and most preferably from about 70-120 Å thick.

In certain example embodiments, it has also been surprisingly found that thinning one or both NiCr based layers in this coating helps to achieve a combination of a lower transmissive b* value and higher visible transmission. In certain example embodiments, one or both of the NiCr based contact layers is from about 4-14 Å thick, more preferably from about 4-12 Å thick, and most preferably from about 6-11 Å thick. It is believed that the higher visible transmission and the improved b* values may be a result of a combination of the thin NiCr based layer(s) and the titanium oxide based layer. This higher visible transmission and acceptable b* combination is especially desirable, because it permits more silver to be added (thicker silver based layer(s)) which increases LSG without sacrificing optical performance. This combination thereby results in the surprisingly high LSG values achievable by this coating.

In certain example embodiments of this invention, there is provided a insulating glass (IG) window unit including a coated article including a coating supported by a glass substrate, the coating comprising: first and second infrared (IR) reflecting layers, wherein said IR reflecting layers are spaced apart from one another by a plurality of dielectric layers, and wherein the first IR reflecting layer is located closer to the glass substrate than is the second IR reflecting layer; a bottom dielectric stack provided between the first IR reflecting layer and the glass substrate, wherein the bottom dielectric stack comprises in a direction moving away from the glass substrate a first dielectric layer, a layer comprising titanium oxide and/or niobium oxide, and a second dielectric layer, and wherein the layer comprising titanium oxide and/or niobium oxide is located between and directly contacting the first and second dielectric layers; a contact layer comprising metal and/or metal oxide located over and directly contacting at least one of the IR reflecting layers comprising silver, wherein the contact layer is from about 4-14 Å thick; and wherein the glass substrate is spaced apart from another glass substrate in the IG window unit, and wherein the IG window unit has an LSG value ($T_{vis}$/SHGC) of at least 2.0, and a visible transmission of at least about 60%.

In certain other example embodiments of this invention, there is provided a method of making an insulating glass (IG) window unit including a coated article including a coating supported by a glass substrate, the method including forming the coating on the glass substrate comprising the steps of: forming first and second infrared (IR) reflecting layers comprising silver on the glass substrate, wherein said IR reflecting layers are spaced apart from one another by at least one dielectric layer that is located therebetween, and wherein the first IR reflecting layer is located closer to the glass substrate than is the second IR reflecting layer; forming a bottom dielectric stack provided between the first IR reflecting layer and the glass substrate via at least sputtering, wherein the bottom dielectric stack comprises moving away from the glass substrate a first layer comprising silicon nitride, a layer comprising titanium oxide, and optionally a second layer comprising silicon nitride, and wherein the layer comprising titanium oxide is located between and directly contacting the first and second layers comprising silicon nitride; and forming a contact layer comprising NiCr located over and directly contacting at least one of the IR reflecting layers comprising silver, wherein the contact layer comprising NiCr is from about 4-14 Å thick.

BRIEF DESCRIPTION OF THE DRAWINGS

FIG. 1 is a cross sectional view of a coated article according to an example embodiment of this invention.

DETAILED DESCRIPTION OF EXAMPLE EMBODIMENTS OF THE INVENTION

Coated articles herein may be used in applications such as IG window units, vehicle windows, residential windows, and/or any other suitable application that includes glass substrate(s). Certain example embodiments of this invention relate to a coated article including a low-E coating. In certain example embodiments, a titanium oxide inclusive bottom layer stack and a NiCr-based layer(s) are designed to improve b* coloration values and/or transmission of the coated article. These layer stack portions also are advantageous in that they permit a double-silver coated article to achieve (i) an LSG value ($T_{vis}$/SHGC) of at least 2.00, (ii) an SHGC value of no greater than 35% (or 0.35), more preferably no greater than 33, 32 or 30% (or 0.30), (iii) a U-value (BTU $h^{-1}$ $ft^{-2}$ ° $F.^{-1}$) (e.g., x=12 mm) of no greater than 0.30, more preferably no greater than 0.28 or 0.25, and (iv) a visible transmission (Ill. C. 2 degree) of at least about 60%, more preferably of at least about 65%, even more preferably of at least about 70% or 72%. The above characteristics are provided when the coated article is in a monolithic form, or in the context of an IG (insulating glass) window unit. In certain example embodiments, the titanium oxide based layer may be an interlayer comprising titanium oxide provided in a bottom portion of the layer stack between first and second layers comprising silicon nitride, and located between the glass substrate and the bottom infrared (IR) reflecting layer comprising silver. Coated articles according to certain example embodiments of this invention may be used in the context of insulating glass (IG) window units, monolithic applications, laminated windows, other types of windows, or in any other suitable application such as electronic devices. In certain example embodiments of this invention, the coating includes a double-silver stack, although this invention is not so limited in all instances.

For example, in certain example embodiments of this invention, heat treated or non-heat treated coated articles having multiple IR reflecting layers (e.g., two spaced apart silver based layers) are capable of realizing a sheet resistance ($R_s$) of less than or equal to 3.0 (more preferably less than or equal to 2.5, even more preferably less than or equal to 2.1, and most preferably less than or equal to 2.0, 1.9 or 1.8 ohms/square).

FIG. 1 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 1.0 mm to 3.5 mm thick), and low-E coating (or layer system) 30 provided on the substrate 1 either directly or indirectly. The coating (or layer system) 30 includes, for example: bottom dielectric silicon nitride layer 3 which may be $Si_3N_4$, of the Si-rich type for haze reduction, or of any other suitable stoichiometry silicon nitride in different embodiments of this invention, color tuning titanium oxide based layer 4 (e.g., of or including $TiO_2$ or the like), optional additional dielectric silicon nitride layer 5 which may be $Si_3N_4$, of the Si-rich type for haze reduction, or of any other suitable stoichiometry silicon nitride, first lower contact layer 7 (which contacts bottom IR reflecting layer 9), first conductive and preferably metallic infrared (IR) reflecting layer 9, first upper contact layer 11 (which contacts layer 9), dielectric layer 13 (which may be deposited in one or multiple steps in different embodiments of this invention), another silicon nitride based and/or inclusive layer 14, tin oxide inclusive based and/or inclusive interlayer 15, second lower contact layer 17 (which contacts IR reflecting layer 19), second conductive and preferably metallic IR reflecting layer 19, second upper contact layer 21 (which contacts layer 19), dielectric layer 23, and finally protective dielectric layer 25. The "contact" layers 7, 11, 17 and 21 each contact at least one IR reflecting layer (e.g., layer based on Ag). The aforesaid layers 3-25 make up low-E (i.e., low emissivity) coating 30 that is provided on glass or plastic substrate 1.

In monolithic instances, the coated article includes only one glass substrate 1 as illustrated in FIG. 1. However, monolithic coated articles herein may be used in devices such as laminated vehicle windshields, IG window units, and the like. As for IG window units, an IG window unit may include two spaced apart glass substrates. An example IG window unit is illustrated and described, for example, in U.S. Patent Document No. 2004/0005467, the disclosure of which is hereby incorporated herein by reference. An example IG window unit may include, for example, the coated glass substrate 1 shown in FIG. 1 coupled to another glass substrate via spacer (s), sealant(s) or the like, with a gap being defined therebetween. This gap between the substrates in IG unit embodiments may in certain instances be filled with a gas such as argon (Ar). An example IG unit may comprise a pair of spaced apart clear glass substrates each about 3-4 mm thick, one of which is coated with a coating 30 herein in certain example instances, where the gap between the substrates may be from about 5 to 30 mm, more preferably from about 10 to 20 mm, and most preferably about 16 mm. In certain example instances, the coating 30 may be provided on the interior surface of either substrate facing the gap. In certain example embodiments, the coating 30 is provided on the non-tin side (in the context of float glass) of the glass substrate of an IG unit closest to the sun; i.e., on the #2 surface of the IG unit.

Titanium oxide based layer 4 is, in certain example embodiments of this invention, located between and contacting dielectric layers 3 and 5. The titanium oxide based layer 4 is advantageous in that it is useful for color tuning, as it allows the transmissive b* value of the coated article to be maintained at a desirable level (fairly low)—this is not achieved by using only silicon nitride at any reasonable thickness with no titanium oxide based layer 4. In certain example embodiments, niobium oxide may be used instead of or in addition to titanium oxide for or in high index layer 4. Thus; layer 4 whether of or including titanium oxide and/or niobium oxide preferably has a refractive index (n) of at least about 2.3 in certain example embodiments of this invention. The titanium oxide based layer 4 is also advantageous in that it allows realization of a desirable high reflective glass side b* value (less blue outside reflectance) for the coated article, and also results in a higher visible transmission of the coated article. In certain example embodiments, the titanium oxide based layer 4 is from about 40-400 Å thick, more preferably from about 50-200 Å thick, and most preferably from about 70-120 Å thick.

In certain example embodiments, the process of making the $TiO_x$ based layer 4 can achieve a higher dynamic deposition rate (DDR). In particular, $O_2$ gas flow during sputtering of the Ti based target(s) can be decreased to about 0.4 to 0.65, more preferably from about 0.55 to 0.65, from the typical 0.7 ml/kW. Using a gas flow lower than that is not desirable, because DDR absorption can increase too much, and 0.7 ml/kW and higher is undesirable in that the layer becomes a linespeed bottleneck in the manufacturing process.

In certain example embodiments, an interlayer 15 comprising tin oxide or the like may be provided under an upper infrared (IR) reflecting layer 19 and in particular between respective layers comprising silicon nitride 14 and zinc oxide 17. It has been found that the use of such a tin oxide inclusive interlayer (or adhesion layer) 15 results in significantly improved thermal stability, mechanical durability (e.g., scratch resistance), and haze characteristics. For example, with regard to thermal stability, it has been found that the use of such a tin oxide inclusive interlayer 15 results in a coated article which is capable of realizing one or more of: (a) less visible transmission shift due to heat treatment, (b) higher visible transmission following heat treatment; (c) less shifting of certain color value(s) due to heat treatment, (d) substantially neutral coloration following heat treatment; (e) more stable, or even decreasing, sheet resistance due to heat treatment, (f) lower sheet resistance and thus lower emissivity following heat treatment, and/or (g) improved haze characteristics following heat treatment. It has also been found that the provision of this tin oxide inclusive interlayer 15 is also capable of significantly improving mechanical durability and haze characteristics of the coated article, compared to if the layer were not present. These surprisingly results, which in certain example instances are associated with the use of the combination layer stack portion of glass . . . $Si_xN_y/SnO_2$/ZnO/Ag . . . , are highly advantageous, since mechanical durability, higher visible transmission, lower emissivity, lower sheet resistance, reduced haze, and/or improved thermal stability are typically desired features in coated articles.

Dielectric layers 3, 5 and 14 may be of or include silicon nitride in certain embodiments of this invention. Silicon nitride layers 3, 5 and 14 may, among other things, improve heat-treatability of the coated articles, e.g., such as thermal tempering or the like. The silicon nitride of layers 3, 5 and/or 14 may be of the stoichiometric type (i.e., $Si_3N_4$), or alternatively of the Si-rich type in different embodiments of this invention. For example, Si-rich silicon nitride 3 (and/or 5, 14) combined with zinc oxide and/or tin oxide under a silver based IR reflecting layer may permit the silver to be deposited (e.g., via sputtering or the like) in a manner which causes its sheet resistance to be lessened compared to if certain other material(s) were under the silver. Moreover, the presence of free Si in a Si-rich silicon nitride inclusive layer 3 (5 and/or 14) may allow certain atoms such as sodium (Na) which migrate outwardly from the glass 1 during HT to be more efficiently stopped by the Si-rich silicon nitride inclusive layer before they can reach the silver and damage the same. Thus, it is believed that the Si-rich $Si_xN_y$ can reduce the amount of damage done to the silver layer(s) during HT in certain example embodiments of this invention thereby allowing sheet resistance ($R_s$) to decrease or remain about the same in a satisfactory manner. Moreover, it is believed that the Si-rich $Si_xN_y$ in layer 3 and/or 5 can reduce the amount of damage (e.g., oxidation) done to absorbing layer 4 during HT in certain example optional embodiments of this invention. It is also possible that a zirconium oxide and/or nitride layer (not shown) be provided over top of the top silicon nitride based layer 25 in certain example embodiments of this invention, as a protective overcoat layer.

In certain example embodiments, when Si-rich silicon nitride is used in layer 3, 5 and/or 14, the Si-rich silicon nitride layer as deposited may be characterized by $Si_xN_y$ layer(s), where x/y may be from 0.76 to 1.5, more preferably from 0.8 to 1.4, still more preferably from 0.85 to 1.2. Moreover, in certain example embodiments, before and/or after HT the Si-rich $Si_xN_y$ layer(s) may have an index of refraction "n" of at least 2.05, more preferably of at least 2.07, and sometimes at least 2.10 (e.g., 632 nm) (note: stoichiometric $Si_3N_4$ which may also be used has an index "n" of 2.02-2.04). In certain example embodiments, it has surprisingly been found that improved thermal stability is especially realizable when the Si-rich $Si_xN_y$ layer(s) as deposited has an index of refraction "n" of at least 2.10, more preferably of at least 2.20, and most preferably from 2.2 to 2.4. Also, the Si-rich $Si_xN_y$ layer in certain example embodiments may have an extinction coefficient "k" of at least 0.001, more preferably of at least 0.003 (note: stoichiometric $Si_3N_4$ has an extinction coefficient "k" of effectively 0). Again, in certain example embodiments, it has surprisingly been found that improved thermal stability can be realized when "k" for the Si-rich $Si_xN_y$ layer(s) is from 0.001 to 0.05 as deposited (550 nm). It is noted that n and k tend to drop due to heat treatment. Any and/or all of the silicon nitride layers discussed herein may be doped with other materials such as stainless steel or aluminum in certain example embodiments of this invention. For example, any and/or all silicon nitride layers discussed herein may optionally include from about 0-15% aluminum, more preferably from about 1 to 10% aluminum, in certain example embodiments of this invention. The silicon nitride may be deposited by sputtering a target of Si or SiAl in certain embodiments of this invention. Oxygen may also be provided in certain instances in the silicon nitride layers.

Infrared (IR) reflecting layers 9 and 19 are preferably substantially or entirely metallic and/or conductive, and may comprise or consist essentially of silver (Ag), gold, or any other suitable IR reflecting material. IR reflecting layers 9 and 19 help allow the coating to have low-E and/or good solar control characteristics. The IR reflecting layers may, however, be slightly oxidized in certain embodiments of this invention. In certain example embodiments, the upper IR reflecting layer 19 is significantly thicker than the lower IR reflecting layer 9 (e.g., by at least about 15 or 25 Å).

The upper contact layers 11 and 21 may be of or include nickel (Ni) oxide, chromium/chrome (Cr) oxide, or a nickel alloy oxide such as nickel chrome oxide ($NiCrO_x$), or other suitable material(s), in certain example embodiments of this invention. The use of, for example, NiCr in these layers (11 and/or 21) allows durability to be improved. The NiCr of layers 11 and/or 21 may be fully oxidized in certain embodiments of this invention (i.e., fully stoichiometric), or alternatively may only be partially oxidized. In certain instances, the $NiCrO_x$ layers 11 and/or 21 may be at least about 50% oxidized, but not fully oxidized in the final product. Contact layers 11 and/or 21 (e.g., of or including an oxide of Ni and/or Cr) may or may not be oxidation graded in different embodiments of this invention. Oxidation grading means that the degree of oxidation in the layer changes throughout the thickness of the layer so that for example a contact layer may be graded so as to be less oxidized at the contact interface with the immediately adjacent IR reflecting layer than at a portion of the contact layer(s) further or more/mast distant from the immediately adjacent IR reflecting layer. Descriptions of various types of oxidation graded contact layers are set forth in U.S. Pat. No. 6,576,349, the disclosure of which is hereby incorporated herein by reference, although other types of oxide grading may also be performed for these layers. Contact layers 11 and/or 21 (e.g., of or including an oxide of Ni and/or Cr) may or may not be continuous in different embodiments of this invention across the entire IR reflecting layer. While the contact layers 11, 21 are of or include Ni and/or Cr in preferred embodiments, it is possible that other materials such as titanium oxide or the like may be used for these layers.

In certain example embodiments, it has also been surprisingly found that thinning one or both NiCr based layers 11 and/or 21 helps to achieve a combination of a lower transmissive b* value and higher visible transmission $T_{vis}$. In certain example embodiments, one or both of the NiCr based contact layers 11 and/or 21 is from about 4-14 Å thick, more preferably from about 4-12 Å thick, and most preferably from about 5-8 Å thick. It is believed that the higher visible transmission and the improved b* values may be a result of a combination of the thin NiCr based layer(s) 11 and/or 21 and the titanium oxide based layer 4. This higher visible transmission and acceptable b* combination is especially desirable, because it permits more silver to be added (thicker silver based layer(s) 9 and/or 19) which increases LSG of the coated article without sacrificing optical performance. This combination thereby results in the surprisingly high LSG values achievable by this coating. In certain example embodiments, one or both of the NiCr based layers 11 and 21 may be originally sputter-deposited in metallic or substantially metallic form (not significantly oxidized). Then, they may become partially oxided during sputter-deposition of the overlying tin oxide or other metal oxide based layer(s) 13, 23. This may result in an oxidation, graded and/or substoichometric oxidation of the NiCr based layer(s) 11 and/or 21.

Dielectric layer 13 may be of or include tin oxide in certain example embodiments of this invention. However, as with other layers herein, other materials may be used in different instances.

Lower contact layers 7 and/or 17 in certain embodiments of this invention are of or include zinc oxide (e.g., ZnO). The zinc oxide of layers 7 and 17 may contain other materials as well such as Al (e.g., to form $ZnAlO_x$). For example, in certain example embodiments of this invention, one or more of zinc oxide layers 7, 17 may be doped with from about 1 to 10% Al, more preferably from about 1 to 5% Al, and most preferably about 1 to 4% Al. In certain example embodiments, the lower zinc oxide based contact layer 7 is thinner than the upper zinc oxide based contact layer 17, by at least about 10 Å, more preferably by at least about 15 or 20 Å. It has been found that this improves coloration and/or transmission of the coating.

Interlayer 15 of or including tin oxide is provided under IR reflecting layer 19 so as to be located between silicon nitride layer 14 and zinc oxide layer 17. Surprisingly, as explained above, it has been found that the use of such a tin oxide inclusive interlayer 15 results in numerous improvements compared to a situation where the layer is not provided. For example, it has been found that the use of such a tin oxide inclusive interlayer 15 results in a coated article which is capable of realizing: (a) less visible transmission shift due to heat treatment, (b) higher visible transmission following heat treatment; (c) less shifting of certain color value(s) due to heat treatment, (d) substantially neutral coloration following heat treatment; (e) more stable, or even decreasing, sheet resistance due to heat treatment, (f) lower sheet resistance and thus lower emissivity following heat treatment, (g) improved haze characteristics following heat treatment, and/or (h) improved mechanical durability such as scratch resistance before and/or after heat treatment. Thus, in certain example embodiments of this invention, coated articles may be taken to higher temperatures during heat treatment and/or for longer times without suffering undesirable significant transmission drops and/or increases in sheet resistance. In certain alternative embodiments, it is possible to dope the tin oxide of layer 15 with other materials such as Al, Zn or the like. Alternatively, other metal oxide(s) may be used for layer 15 in certain instances.

Dielectric layer 23 may be of or include tin oxide in certain example embodiments of this invention. However, layer 23 is optional and need not be provided in certain example embodiments of this invention. Dielectric layer 25, which may be an overcoat in certain example instances, may be of or include silicon nitride (e.g., $Si_3N_4$) or any other suitable material in certain example embodiments of this invention. Optionally, other layers may be provided above layer 25. Layer 25 is provided for durability purposes, and to protect the underlying layers during heat treatment and/or environmental use. In certain example embodiments, layer 25 may have an index of refraction (n) of from about 1.9 to 2.2, more preferably from about 1.95 to 2.05.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses and materials may be used in layers in different embodiments of this invention, example thicknesses and materials for the respective layers on the glass substrate 1 in the FIG. 1 embodiment are as follows, from the glass substrate outwardly (an example of the titanium oxide based layer is about 80 angstroms):

Example Materials/Thicknesses; FIG. 1 Embodiment

| Layer Glass (1-10 mm thick) | Preferred Range (Å) | More Preferred (Å) | Example (Å) |
|---|---|---|---|
| $Si_xN_y$ (layer 3) | 40-250 Å | 125-175 Å | 150 Å |
| $TiO_x$ (layer 4) | 40-400 Å | 50-200 Å | 70-120 Å |
| $Si_xN_y$ (optional layer 5) | 40-450 Å | 50-150 Å | 75 Å |
| $ZnO_x$ (layer 7) | 10-300 Å | 50-85 Å | 70 Å |
| Ag (layer 9) | 100-180 Å | 125-160 Å | 139 Å |
| $NiCrO_x$ (layer 11) | 4-14 Å | 4-12 Å | 5 Å |
| $SnO_2$ (layer 13) | 0-1,000 Å | 200-700 Å | 585 Å |
| $Si_xN_y$ (layer 14) | 50-450 Å | 60-100 Å | 80 Å |
| $SnO_2$ (layer 15) | 30-250 Å | 50-200 Å | 109 Å |
| $ZnO_x$ (layer 17) | 10-300 Å | 40-150 Å | 96 Å |
| Ag (layer 19) | 130-220 Å | 140-200 Å | 169 Å |
| $NiCrO_x$ (layer 21) | 4-14 Å | 4-12 Å | 5 Å |
| $SnO_2$ (layer 23) | 0-750 Å | 40-200 Å | 127 Å |
| $Si_3N_4$ (layer 25) | 0-750 Å | 80-320 Å | 215 Å |

In certain example embodiments of this invention, coated articles herein may have the following optical and solar characteristics set forth in Table 2 when measured monolithically (before any optional HT). The sheet resistances ($R_s$) herein take into account all IR reflecting layers (e.g., silver based layers 9, 19).

Optical/Solar Characteristics (Monolithic; no-HT)

| Characteristic | General | More Preferred | Most Preferred |
|---|---|---|---|
| $R_s$ (ohms/sq.): | <=2.5 | <=2.1 | <=1.9 (or <=1.8) |
| $E_n$: | <=0.06 | <=0.03 | <=0.025 |
| $T_{vis}$ (Ill. C. 2°): | >=60% | >=65% | >=70 or 72% |
| $a*_t$ (Ill. C. 2°): | -6 to +1.0 | -5 to -3.0 | -4.2 to -4.0 |
| $b*_t$ (Ill. C. 2°): | -2.0 to +4.0 | 0.0 to 2.0 | 0.5 to 1.7 |
| $L*$ (Ill. C. 2°): | 80-95 | 84-95 | 86-89 |
| $R_fY$ (Ill. C., 2 deg.): | 1 to 13% | 1 to 12% | 5-9% |
| $a*_f$ (Ill. C., 2°): | -15.0 to +2.0 | -10.0 to -4.0 | -7.5 to -6.0 |
| $b*_f$ (Ill. C., 2°): | -30.0 to +4.0 | -2.0 to +3.5 | 0 to 2.0 |
| $L*$ (Ill. C. 2°): | 30-45 | 32-41 | 32-34 |
| $R_gY$ (Ill. C., 2 deg.): | 1 to 14% | 1 to 13% | 5-9% |
| $a*_g$ (Ill. C., 2°): | -5.0 to 0 | -4.0 to -1.0 | -3 to -1 |
| $b*_g$ (Ill. C., 2°): | -14.0 to 0 | -13.0 to -7.0 | -12 to -8 |
| $L*$ (Ill. C. 2°): | 30-40 | 31-35 | 32-33 |

Optical/Solar Characteristics (Monolithic; post-HT [e.g., tempered])

| Characteristic | General | More Preferred | Most Preferred |
|---|---|---|---|
| $R_s$ (ohms/sq.): | <=2.5 | <=2.1 | <=1.9 (or <=1.8) |
| $E_n$: | <=0.06 | <=0.03 | <=0.025 |
| $T_{vis}$ (Ill. C. 2°): | >=65% | >=70% | >=72 or 73% |
| $a*_t$ (Ill. C. 2°): | -6 to +1.0 | -5 to -3.0 | -4.8 to -4.4 |
| $b*_t$ (Ill. C. 2°): | -2.0 to +5.0 | 0.0 to 4.0 | 1.0 to 3.5 |
| $L*$ (Ill. C. 2°): | 80-95 | 84-95 | 86-89 |
| $R_fY$ (Ill. C., 2 deg.): | 1 to 13% | 1 to 12% | 5-9% |
| $a*_f$ (Ill. C., 2°): | -15.0 to +2.0 | -10.0 to -4.0 | -7.5 to -6.0 |
| $b*_f$ (Ill. C., 2°): | -30.0 to +4.0 | -4.0 to -0.5 | -3.5 to -1.5 |
| $L*$ (Ill. C. 2°): | 30-45 | 32-41 | 29-32 |
| $R_gY$ (Ill. C., 2 deg.): | 1 to 14% | 1 to 13% | 5-9% |
| $a*_g$ (Ill. C., 2°): | -5.0 to 0 | -4.0 to +1.0 | -2 to +0.5 |
| $b*_g$ (Ill. C., 2°): | -14.0 to 0 | -13.0 to -8.0 | -12 to -9 |
| $L*$ (Ill. C. 2°): | 30-40 | 31-35 | 30-32 |

Moreover, in certain example laminated embodiments of this invention, coated articles herein which have been optionally heat treated to an extent sufficient for tempering, and which have been coupled to another glass substrate to form an IG unit, may have the following IG unit optical/solar characteristics. Example IG characteristics may be for example about 2.3 mm thick glass sheets, an approximate 16 mm gap/spacers, substantially clear glass, and the coating on surface #2. Or alternatively, about 2.5 mm thick clear glass substrates with an approximate 12.0 mm gap therebetween.

Optical/Solar Characteristics (IG Unit)

| Characteristic | General | More Preferred | Most Preferred |
|---|---|---|---|
| $R_s$ (ohms/sq.): | <=2.5 | <=2.1 | <=1.9 (or <=1.8) |
| $E_n$: | <=0.06 | <=0.03 | <= 0.025 |
| LSG ($T_{vis}$/SHGC): | >=2.0 | >=2.01 | >=2.02 |
| $T_{vis}$ (Ill. C. 2°): | >=60% | >=63% | >=65 or 66% |
| $a*_t$ (Ill. C. 2°): | -8 to 0 | -7 to -2.0 | -6.0 to -3.8 |
| $b*_t$ (Ill. C. 2°): | -2.0 to +4.0 | 0.0 to 2.2 | 0.75 to 1.85 |
| $L*$ (Ill. C. 2°): | 80-90 | 81-87 | 82-86 |
| Outside Y (Ill. C., 2): | 1 to 13% | 1 to 12% | 10-12% |
| $a*_g$ (Ill. C., 2°): | -7.0 to 0 | -5.0 to -1.5 | -4.0 to -2.0 |
| $b*_g$ (Ill. C., 2°): | -10.0 to -2.0 | -9.0 to -4.5 | -8.5 to -5.5 |
| $L*$ (Ill. C. 2°): | 30-45 | 37-42 | 39-42 |
| Inside Y (Ill. C., 2): | 8.5 to 14.5% | 10 to 12.5% | 10.5-12% |
| $a*_f$ (Ill. C., 2°): | -7.0 to 0 | -6 to -3.0 | -5 to -3.5 |
| $b*_f$ (Ill. C., 2°): | -7.0 to +4 | -5.0 to +2 | -4 to +1 |
| $L*$ (Ill. C. 2°): | 37-47 | 40-46 | 43-45 |
| SHGC (% US): | <=35% | <=33 or 32% | <=30% |
| U-Value: | <=0.30 | <=0.28 | <=0.25 |

The following example is provided for purposes of example only, and is not intended to be limiting unless specifically claimed.

EXAMPLES

The following Example 1 was made via sputtering on 2.3 mm thick clear glass substrate so as to have approximately the layer stack set forth below.

| Layer Glass (2.3 mm thick) | Thickness (Å) |
|---|---|
| $Si_xN_y$ (layer 3) | 150 Å |
| $TiO_2$ (layer 4) | 80 Å |
| $ZnO_x$ (layer 7) | 70 Å |
| Ag (layer 9) | 139 Å |

-continued

| Layer<br>Glass (2.3 mm thick) | Thickness (Å) |
|---|---|
| $NiCrO_x$ (layer 11) | 5 Å |
| $SnO_2$ (layer 13) | 585 Å |
| $Si_xN_y$ (layer 14) | 80 Å |
| $SnO_2$ (layer 15) | 109 Å |
| $ZnO_x$ (layer 17) | 96 Å |
| Ag (layer 19) | 169 Å |
| $NiCrO_x$ (layer 21) | 5 Å |
| $SnO_2$ (layer 23) | 127 Å |
| $Si_3N_4$ (layer 25) | 215 Å |

The Example above had characteristics in monolithic and in IG unit form within the ranges in the right-hand columns of the charts set forth above.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. An insulating glass (IG) window unit including a coated article including a coating supported by a glass substrate, the coating comprising:
   first and second infrared (IR) reflecting layers comprising silver, wherein said IR reflecting layers are spaced apart from one another by at least one dielectric layer that is located therebetween, and wherein the first IR reflecting layer is located closer to the glass substrate than is the second IR reflecting layer, wherein the first IR reflecting layer has a thickness of from about 125 to 150 Å, and the second IR reflecting layer has a thickness of from about 140 to 200 Å, and wherein the thickness of the second IR reflecting layer is greater than that of the first IR reflecting layer;
   a bottom dielectric stack provided between the first IR reflecting layer and the glass substrate, wherein the bottom dielectric stack comprises moving away from the glass substrate a first layer comprising silicon nitride, a layer comprising titanium oxide having a thickness of from about 70-120 Å, and a dielectric layer, and wherein the layer comprising titanium oxide is located between and directly contacting the first layer comprising silicon nitride and the dielectric layer;
   a center dielectric stack provided between the first and second IR reflecting layers, wherein the center dielectric stack comprises, moving away from the glass substrate, a first layer comprising tin oxide, a layer comprising silicon nitride, and a layer comprising zinc oxide, wherein the layer comprising zinc oxide is located directly under and contacting the second IR reflecting layer;
   a contact layer from about 4-12 Å thick and comprising Ni and Cr located over and directly contacting at least one of the IR reflecting layers comprising silver; and
   wherein the glass substrate is spaced apart from another glass substrate in the IG window unit, and wherein the IG window unit has an LSG value ($T_{vis}$/SHGC) of at least 2.0, an SHGC value of no greater than 0.33, a U-value of no greater than 0.30, a visible transmission of at least about 60%, and wherein the IG window unit has at least one of: an outside b* color value of from about −8.5 to −5.5, and a transmissive b* color value of from about 0.75 to 1.85.

2. The IG window unit of claim 1, wherein the coated article includes only two IR reflecting layers comprising silver.

3. The IG window unit of claim 1, wherein said IG unit has a visible transmission of at least about 65%.

* * * * *